United States Patent
Wang et al.

(10) Patent No.: US 6,801,454 B2
(45) Date of Patent: Oct. 5, 2004

(54) VOLTAGE GENERATION CIRCUITRY HAVING TEMPERATURE COMPENSATION

(75) Inventors: Yongliang Wang, Saratoga, CA (US); Raul A. Cernea, Santa Clara, CA (US); Chi-Ming Wang, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/263,016

(22) Filed: Oct. 1, 2002

(65) Prior Publication Data

US 2004/0062085 A1 Apr. 1, 2004

(51) Int. Cl.⁷ .............................................. G11C 16/04
(52) U.S. Cl. .......................... 365/185.18; 365/185.03; 365/211
(58) Field of Search ...................... 365/185.18, 185.03, 365/211

(56) References Cited

U.S. PATENT DOCUMENTS

| | | |
|---|---|---|
| 5,508,971 A | 4/1996 | Cernea et al. |
| 6,434,044 B1 | 8/2002 | Gongwer et al. |
| 6,560,152 B1 | 5/2003 | Cernea |
| 2001/0033512 A1 * | 10/2001 | Banks et al. ........... 365/185.03 |

* cited by examiner

*Primary Examiner*—Hoai Ho
(74) *Attorney, Agent, or Firm*—Beyer Weaver & Thomas, LLP

(57) ABSTRACT

Techniques for producing and utilizing temperature compensated voltages to accurately read signals (e.g., voltages) representing data stored in memory cells of a memory system are disclosed. The memory system is, for example, a memory card. The magnitude of the temperature compensation can be varied or controlled in accordance with a temperature coefficient. These techniques are particularly well suited for used with memory cells that provide multiple levels of storage.

21 Claims, 8 Drawing Sheets

VOLTAGE GENERATION CIRCUITRY HAVING TEMPERATURE COMPENSATION

BACKGROUND OF THE INVENTION

1. Field of the Invention

The invention relates to voltage generation and, more particularly, to voltage generation for memory systems.

2. Description of the Related Art

Memory cards are commonly used to store digital data for use with various products (e.g., electronics products). Examples of memory cards are flash cards that use Flash type or EEPROM type memory cells to store the data. Flash cards have a relatively small form factor and have been used to store digital data for products such as cameras, hand-held computers, set-top boxes, hand-held or other small audio players/recorders (e.g., MP3 devices), and medical monitors. A major supplier of flash cards is SanDisk Corporation of Sunnyvale, Calif.

A conventional memory card (e.g., flash card) includes a memory controller and memory chips. The memory controller operates to supply an address/data bus to each of the memory chips. Since the memory chips require various voltage levels for operation, the memory controller or the memory chips can include a charge pump and regulation circuit. The charge pump and regulation circuit produces several different voltage levels that are used by the memory chips.

The memory cells of memory cards have in recent years been designed to store more than one level. Consequently, each memory cells is able to store a signal that represents one of a plurality of digital values. For example, a single memory cell might store one of four voltage levels. The ability for individual memory cells to store multiple levels allows the storage density of memory cards to be greatly improved. However, the increased density comes at a cost. One such cost is that the subsequent detection of the different voltage levels must now be performed with greater precision because the tolerance is proportionately decreased as storage density increases.

One resulting problem is that memory cells are inherently temperature dependent. In other words, the precise amount of voltage being stored to or read from memory cells will vary with temperature. With tightened tolerances associated with higher storage densities, this temperature dependency can lead to errors when reading out previously stored data. Accordingly, there is a need to manage the temperature dependency of memory cells within memory systems so that such errors do not occur.

SUMMARY OF THE INVENTION

Broadly speaking, the invention relates to techniques for producing and utilizing temperature compensated voltages to accurately read signals (e.g., voltages) representing data stored in memory cells of a memory system. The memory system is, for example, a memory card. The magnitude of the temperature compensation can be varied or controlled in accordance with a temperature coefficient.

The invention can be implemented in numerous ways including, as a system, device, or method. Several embodiments of the invention are discussed below.

As a memory apparatus, one embodiment of the invention includes at least a plurality of memory cells and a voltage generation circuit. Each of the memory cells have multi-state data storage transistor devices that have a temperature dependency. The voltage generation circuit is operatively connected with the memory cells and produces a plurality of different voltage levels. Each of the different voltage levels produced by the voltage generation circuit has a temperature dependency that substantially offsets the temperature dependency of the multi-state data storage transistor devices.

As a voltage generation circuit for generating gate control voltages to be supplied to control gates of multi-state data storage transistor devices, one embodiment of the invention includes at least: a first current generator for producing a first current that is substantially independent of temperature; a second current generator for producing a second current that is dependent on temperature; and a resistor ladder having a plurality of resistors connected in series, with nodes between adjacent pairs of the resistors. The first current is supplied to a first end of the resistor ladder, and the second current is supplied to one of the nodes of the resistor ladder.

As a memory apparatus, one embodiment of the invention includes at least a plurality of memory cells and means for generating a plurality of different voltage levels. Each of the memory cells have multi-state data storage transistor devices that have a temperature dependency. Each of the different voltage levels being generated has a temperature dependency that counteracts the temperature dependency of the multi-state data storage transistor devices.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE INVENTION

The invention relates to techniques for producing and utilizing temperature compensated voltages to accurately read signals (e.g., voltages) representing data stored in memory cells of a memory system. The memory system is, for example, a memory card. The magnitude of the temperature compensation can be varied or controlled in accordance with a temperature coefficient.

Although the invention is suitable for use with both single-state (single-level) memories and multi-state (multi-level) memories, the invention is particularly well suited for used with memory cells that provide multiple states/levels of storage. Hence, the following detailed description describes the invention in the context of memory cells that provide multiple states of storage. In multi-state memories, each memory cell effectively stores two or more bits of data.

Examples of memory cards include PC Card (formerly PCMCIA device), Flash Card, Flash Disk, Multimedia Card, and ATA Card. More generally, a memory system can pertain to not only a memory card but also a memory stick or some other semiconductor memory product.

Embodiments of this aspect of the invention are discussed below with reference to FIGS. 1–7. However, those skilled in the art will readily appreciate that the detailed description given herein with respect to these figures is for explanatory purposes as the invention extends beyond these limited embodiments.

Figure 1:
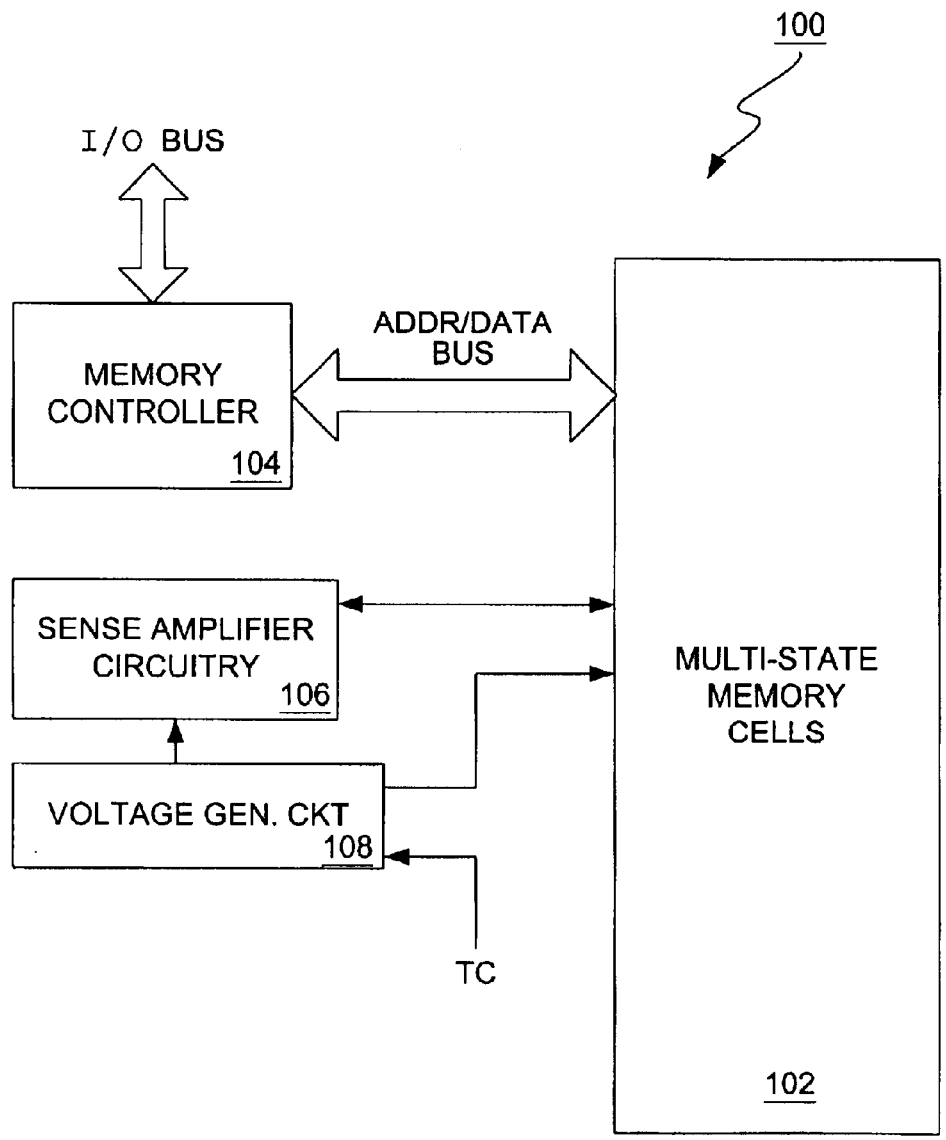
FIG. 1 is a block diagram of a memory system according to one embodiment of the invention.

FIG. 1 is a block diagram of a memory system 100 according to one embodiment of the invention. The memory system 100 includes multi-state memory cells 102. Each of the multi-state memory cells 102 is able to store one of a plurality of different voltage levels. As such, each of the memory cells is able to represent more than one bit of digital data being stored therein. Access to the multi-state memory cells 102 is controlled by a memory controller 104. The memory controller 104 interacts with a host device through an Input/Output (I/O) bus. The memory controller 104 interacts with the multi-state memory cells 102 using an address/data bus for selecting the appropriate ones of the memory cells 102 and providing the appropriate data thereto. The address/data bus is also used to read data from selected ones of the multi-state memory cells. When reading data from the multi-state memory cells 102, sense amplifier circuitry 106 and a voltage generation circuit 108 are utilized. Also, when writing data to the multi-state memory cells 102, the sense amplifier circuitry 106 and the voltage generation circuit 108 are utilized.

In this embodiment, the sense amplifier circuitry 106 and the voltage generation circuit 108 are provided separate from the memory cells 104. However, the sense amplifier circuitry 106 and the voltage generation circuit 108 can alternatively be provided within or integral with or the multi-state memory cells 102. The sense amplifier circuitry 106 and the voltage generation circuit 108 could also be within or integral with the memory controller 104. In any case, the sense amplifier circuitry 106 receives an electronic indication from the multi-state memory cells 102 being read or verified. Such indication is provided to the sense amplifier circuitry 106. The sense amplifier circuitry 106 then determines the digital data being stored in the corresponding memory cells 102 from such indications.

The memory cells 102 receive at least one temperature-dependent voltage provided by the voltage generation circuit 108. Here, the voltage generator circuit 108 produces a voltage in accordance with a temperature coefficient signal (TC). The temperature coefficient signal pertains to the temperature coefficient of the multi-state memory cells 102. In one embodiment, the temperature coefficient signal is predetermined by measurements with respect to the memory cells 102. The voltage generation circuit 108 produces the temperature-dependent voltage based on the temperature coefficient signal. The sense amplifier circuitry 106 performs its sensing operations using a voltage level from the memory cells 102. As a result, the temperature dependence of the multi-state memory cells 102 can be compensated for through the use of the temperature-dependent voltage provided by the voltage generation circuit 108. The memory system 100 thus operates to read and write data to the multi-state memory cells 102 in a manner that is not only efficient but also robust.

Figure 2A:
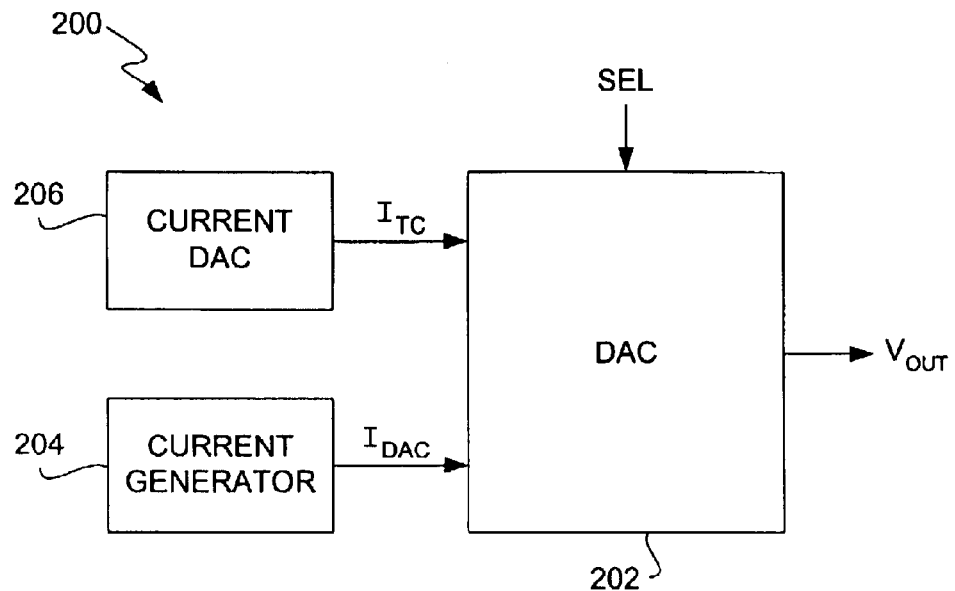
FIG. 2A is a block diagram of a temperature-dependent voltage generation circuit according to one embodiment of the invention.

FIG. 2A is a block diagram of a temperature-dependent voltage generation circuit 200 according to one embodiment of the invention. The temperature-dependent voltage generation circuit 200 is, for example, suitable for use as the voltage generation circuit 108 illustrated in FIG. 1.

The temperature-dependent voltage generator circuit 200 includes a digital-to-analog converter (DAC) 202. Although the DAC 202 is so labeled, the DAC 202 does not actually perform a digital-to-analog conversion but is does operate in a similar manner to convert variable current to voltage levels.

The DAC 202 receives an incoming current signal and outputs one of a plurality of voltage levels. The plurality of different voltage levels being produced by the DAC 202 are utilized to distinguish between a plurality of threshold levels that pertain to the multiple states (levels) of data storage provided within a single memory cell. For example, if a single memory cell stores one of four states, then the DAC 202 would output one of three different voltage levels that pertain to voltages that reside at the transition points between the different threshold levels of the memory cells. As a simplified example, if the three different voltages were 1, 2 and 3 Volts, respectively, then the four levels being distinguished could be less than 1 Volt, between 1 and 2 Volts, between 2 and 3 Volts, and greater than 3 Volts.

The temperature-dependent voltage generation circuit 200 also includes a current generator 204 and a current DAC 206. The current generator 204 produces a current $I_{DAC}$ that represents an amount of current being supplied to the DAC 202 to provide the different voltage levels. In other words, the current $I_{DAC}$ is produced such that the DAC 202 reliably produces the multiple different voltage levels. The DAC 202 also receives a digital select signal (SEL) that is utilized to select one of the multiple different voltage levels to be output as an output voltage $V_{OUT}$.

The current DAC 206 produces a current $I_{TC}$ that is also supplied to the DAC 202. The current $I_{TC}$ is utilized by the DAC 202 to introduce a temperature dependency into the different voltages levels being produced by the DAC 202. The temperature dependency being introduced can be positive or negative. For example, with positive temperature compensation, the different voltage levels being produced by the DAC 202 are gradually increased with increasing temperature. On the other hand, with negative temperature compensation, the different voltage levels being produced by the DAC 202 are gradually decreased with decreasing temperature.

Figure 2B:
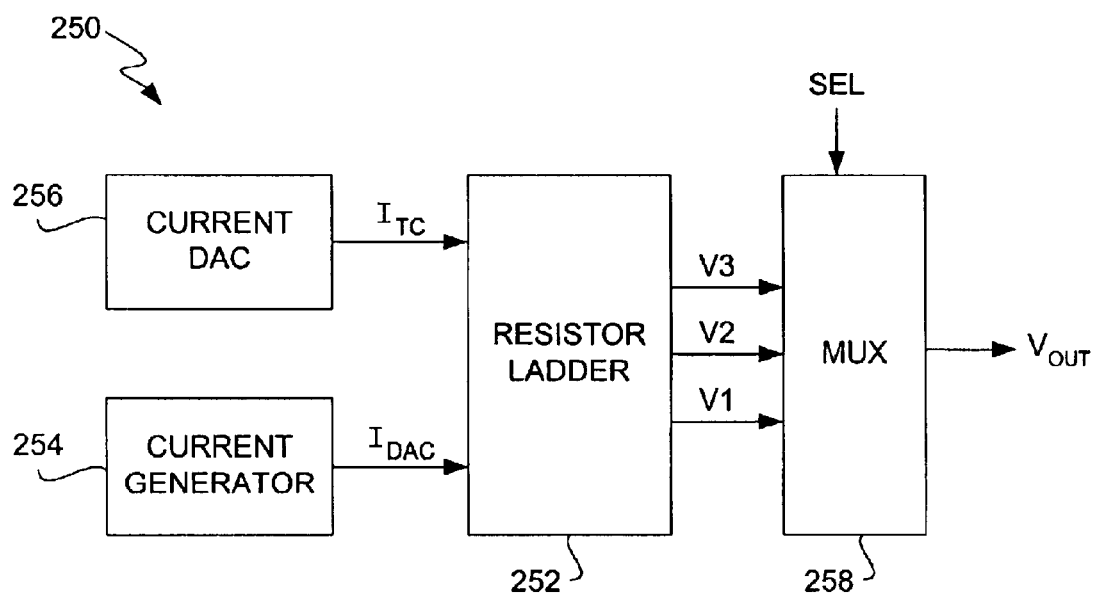
FIG. 2B is a block diagram of a temperature-dependent voltage generation circuit according to another embodiment of the invention.

FIG. 2B is a block diagram of a temperature-dependent voltage generation circuit 250 according to another embodiment of the invention. The temperature dependent voltage generation circuit 250 operates to output one of a plurality of different voltage levels as does the temperature-dependent voltage generation circuit 200 illustrated in FIG. 2A.

The temperature-dependent voltage generation circuit 250 includes a resistor ladder 252 that outputs voltage levels V1, V2 and V3. These voltage levels are produced using a current $I_{DAC}$ produced by a current generator 254 and a current $I_{TC}$ produced by a current DAC 256. Typically, the current $I_{DAC}$ is substantially independent of temperature, whereas the current $I_{TC}$ is intentionally produced such that it has a temperature-dependency. Since the resistor ladder 252 uses both the current $I_{DAC}$ and $I_{TC}$, the voltages V1, V2 and V3 being produced by the resistor ladder 252 have a temperature dependence. The temperature-dependent voltage generation circuit 250 also includes a multiplexer (MUX) 258. The multiplexer 258 receives a digital select signal (SEL) that operates the multiplexer 258 to output one of the voltages V1, V2 and V3 as an output voltage $V_{OUT}$, thereby completing a digital-to-analog conversion.

Figure 3A:
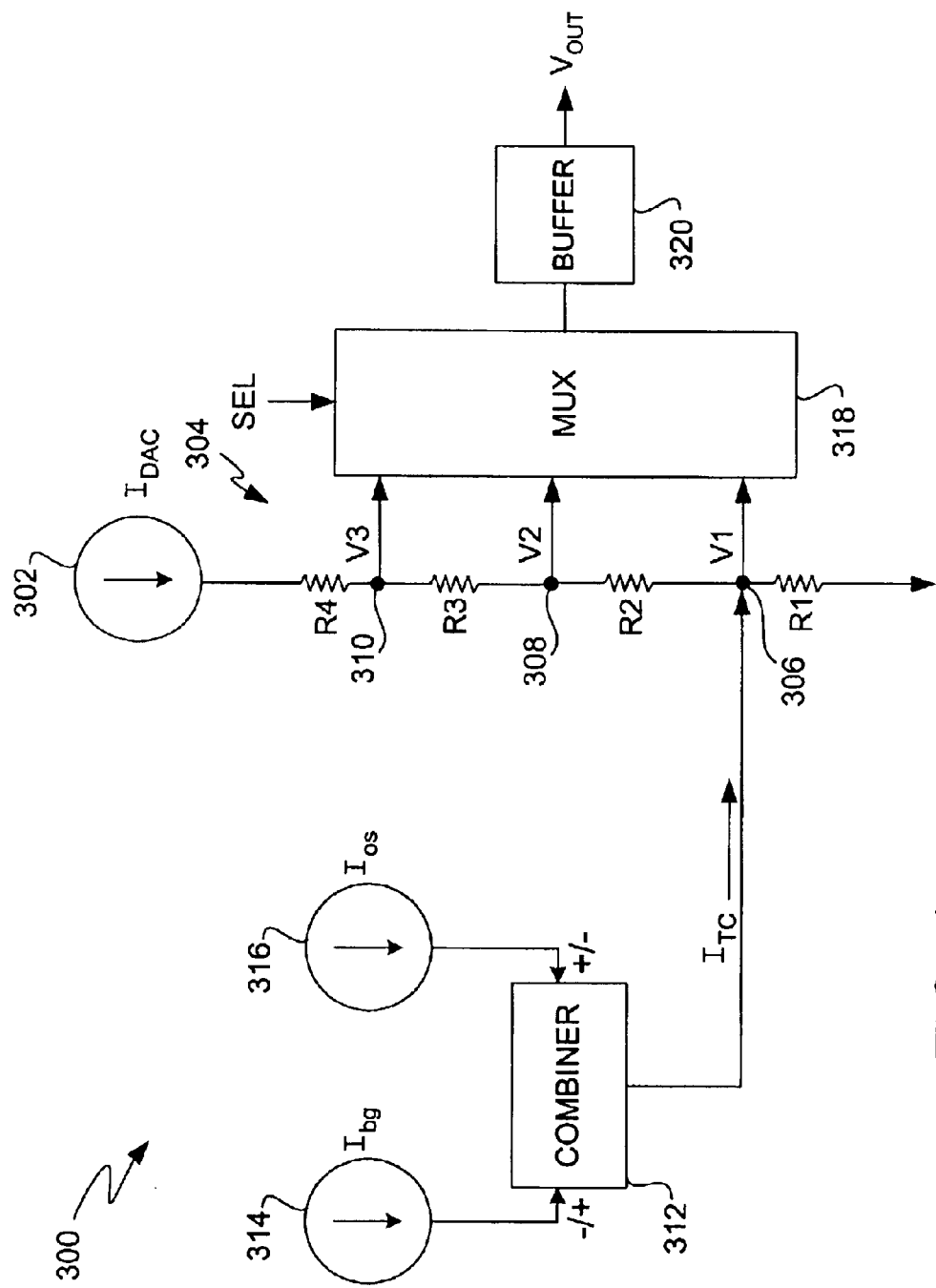
FIG. 3A is a schematic diagram of a temperature-dependent voltage generation circuit according to one embodiment of the invention.

FIG. 3A is a schematic diagram of a temperature-dependent voltage generation circuit 300 according to one embodiment of the invention. The temperature-dependent voltage generation circuit 300 is, for example, suitable for use as one implementation of the temperature-dependent voltage generation circuit 250 illustrated in FIG. 2B.

The temperature-dependent voltage generation circuit 300 includes a current source 302 that supplies a current $I_{DAC}$ to a resistor ladder 304. The resistor ladder 304 includes resistors R1, R2, R3 and R4 connected in series between the current source 302 and a ground potential. The resistor R1 and the resistor R2 couple together at a node 306. The resistor R2 and the resistor R3 couple together at a node 308. The resistor R3 and the resistor R4 couple together at a node 310. The resistor ladder 304 also receives a current $I_{TC}$ at the node 306. The current $I_{TC}$ is a temperature-dependent current that is produced by a combiner 312. The combiner 312 produces the current $I_{TC}$ such that it has either a positive or negative temperature dependence. The combiner 312 receives, as inputs, a band-gap current $I_{bg}$ provided by a current source 314 and an offset current $I_{os}$ provided by a current source 316. The current $I_{DAC}$ and the current $I_{TC}$ are supplied to the resistor ladder 304 to produce multiple voltage levels V1, V2 and V3. The voltage V1 is produced at the node 306, the voltage V2 is produced at the node 308, and the voltage V3 is produced at the node 310. Although the current $I_{TC}$ is supplied to the node 306, the temperature-dependent current produced by the combiner 312 could alternatively be supplied to one or more parts of the resistor ladder 304 (e.g., nodes 308 or 310).

A multiplexer (MUX) 318 receives the multiple voltage levels V1, V2, and V3 from the resistor ladder 304. In accordance with a digital select signal (SEL), the multiplexer 318 selects one of the multiple voltage levels V1, V2 and V3 to be output as an output voltage $V_{OUT}$. The temperature-dependent voltage generation circuit 300 can also include a buffer 320 coupled to the output of the multiplexer 318 to improve isolation and/or drive capability for the output voltage $V_{OUT}$.

Figure 3B:
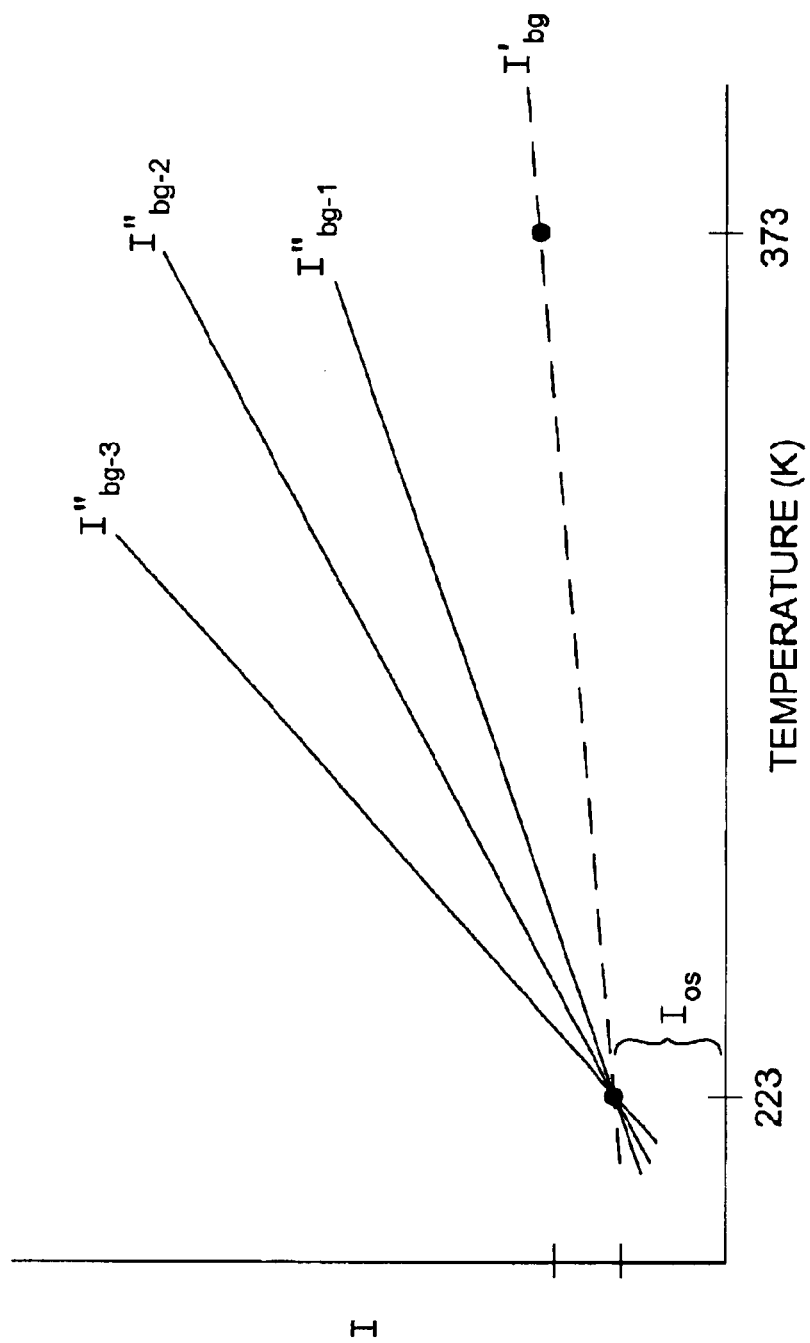

FIG. 3B is a graph illustrating current verses temperature for voltage generation according to one embodiment of the invention. The graph is used to illustrate operation of the temperature-dependent voltage generation circuit 300 illustrated in FIG. 3A. The graph depicts (i) the components of the band-gap current $I_{bg}$ over a range of temperatures (Kelvin) and (ii) the offset current $I_{os}$. Those components of the band-gap current $I_{bg}$ are as follows:

$$I_{bg}=I'_{bg}+I''_{bg}$$

where $I''_{bg}$ has a temperature dependence and where $I'_{bg}$ is substantially independent of temperature. At 223 degrees Kelvin, $I''_{bg}=0$ so $I_{bg}=I'_{bg}=VT*Ln(N)/R1$. The offset current $I_{os}$ is defined as follows:

$$I_{os}=V_{bg}/R_L$$

and at 223 degrees Kelvin, $I_{os}=I_{bg}$. Accordingly, at 233 degrees Kelvin, a base current ($I'_{bg}$) is established and with greater temperatures the band-gap current increases primarily due to the increasing nature of the component $I''_{bg}$. Further, the slope or magnitude of the component current $I''_{bg}$ can be scaled to control the degree of temperature compensation (see, e.g., FIG. 7). Hence, the graph in FIG. 3B illustrates three different slopes (magnitudes) for the component current $I''_{bg}$.

Figure 4:
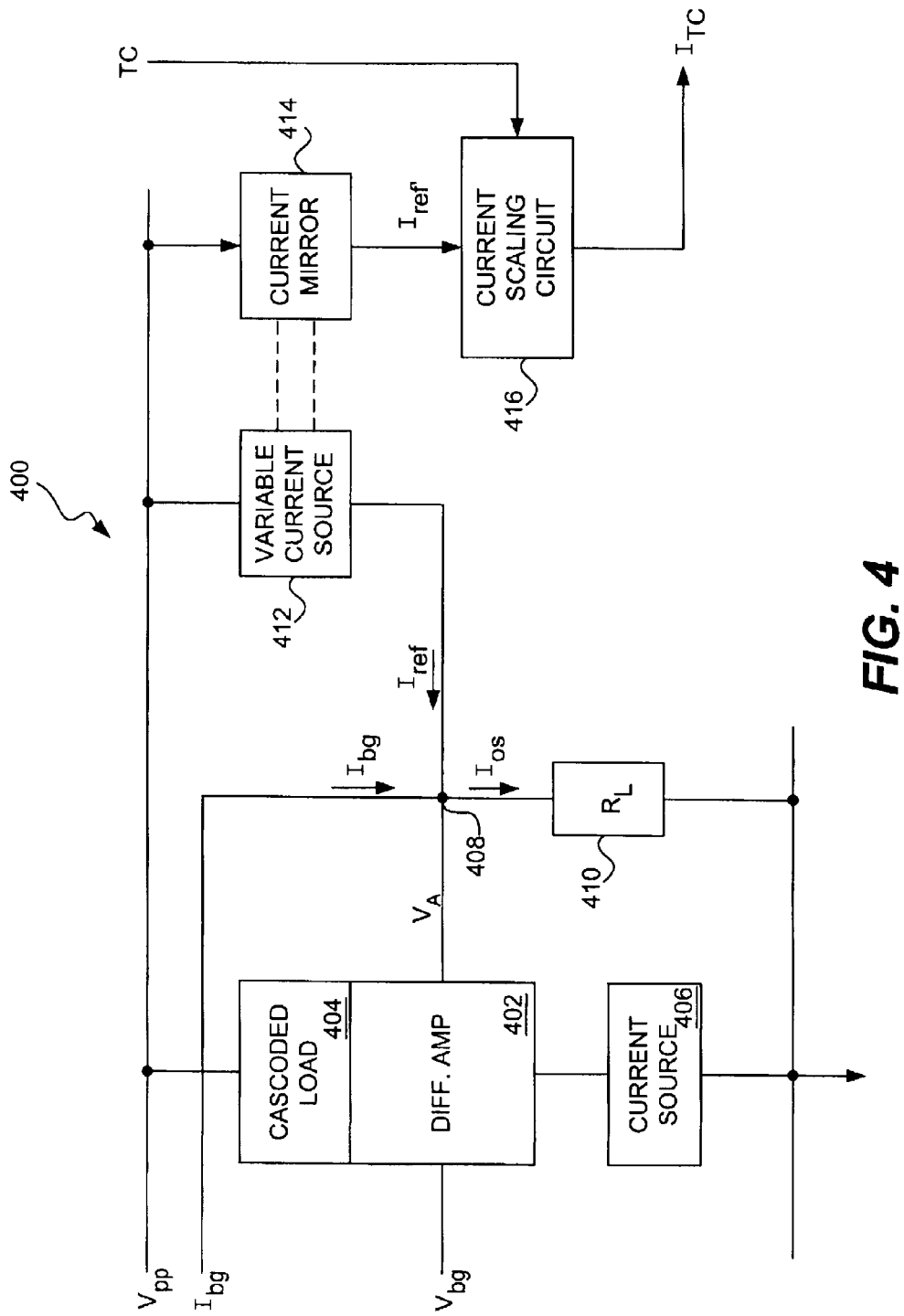
FIG. 4 is a block diagram of a current DAC according to one embodiment of the invention.

FIG. 4 is a block diagram of a current DAC 400 according to one embodiment of the invention. The current DAC 400 produces the current $I_{TC}$ which is a temperature-dependent current. The current DAC 400 is, for example, suitable for use as the current DAC 206 illustrated in FIG. 2A, the current DAC 256 illustrated in FIG. 2B, or as an implementation of the combiner 312 together with the current sources 314 and 316 of FIG. 3A.

The current DAC 400 includes a differential amplifier 402 that receives a band-gap voltage $V_{bg}$ and produces a voltage $V_A$. The differential amplifier 402 has a cascoded load 404 coupled between a first voltage potential $V_{PP}$ and the differential amplifier 402. Further, the differential amplifier 402 is coupled to a second voltage potential (ground) through a current source 406. The voltage $V_A$ produced by the differential amplifier 402 is coupled to a node 408. The node 408 also receives a band-gap current $I_{bg}$. The node 408 is also coupled to the second voltage potential (ground) through a load $R_L$ 410. The current DAC 400 also includes a variable current source 412 that supplies a current $I_{REF}$ to the node 408 as is needed. An offset current $I_{os}$ is induced through the load $R_L$ 410 between the node 408 and the second voltage potential (ground). Hence, the reference current $I_{REF}$ is equal to the offset current $I_{os}$ minus the band-gap current $I_{bg}$.

The reference current $I_{REF}$ merely provides a baseline temperature dependence. However, the current $I_{REF}$ needs control over the degree or amount of temperature compensation that is provided so that the degree or amount of temperature compensation can appropriately vary as the temperature changes. In this regard, the current DAC 400 also includes a current mirror 414 and a current scaling circuit 416. The current mirror 414 produces a current $I_{REF}'$ by mirroring the current $I_{REF}$ produced by the variable current source 412. The current $I_{REF}'$ produced by the current mirror 414 is, however, isolated from the other circuitry that produces the current $I_{REF}$. The current $I_{REF}'$ is supplied to the current scaling circuit 416. The current scaling circuit 416 operates to scale the current $I_{REF}'$ in accordance with a temperature coefficient signal (TC) to produce the current $I_{TC}$. The scaling provided by the current scaling circuit 416 operates to scale the magnitude of the temperature dependent current $I_{REF}'$ to increase the amount of temperature dependency in accordance with the temperature coefficient signal (TC). The current scaling circuit 416 thus operates to control the extent or degree of temperature compensation provided by the current $I_{TC}$.

Figure 5:
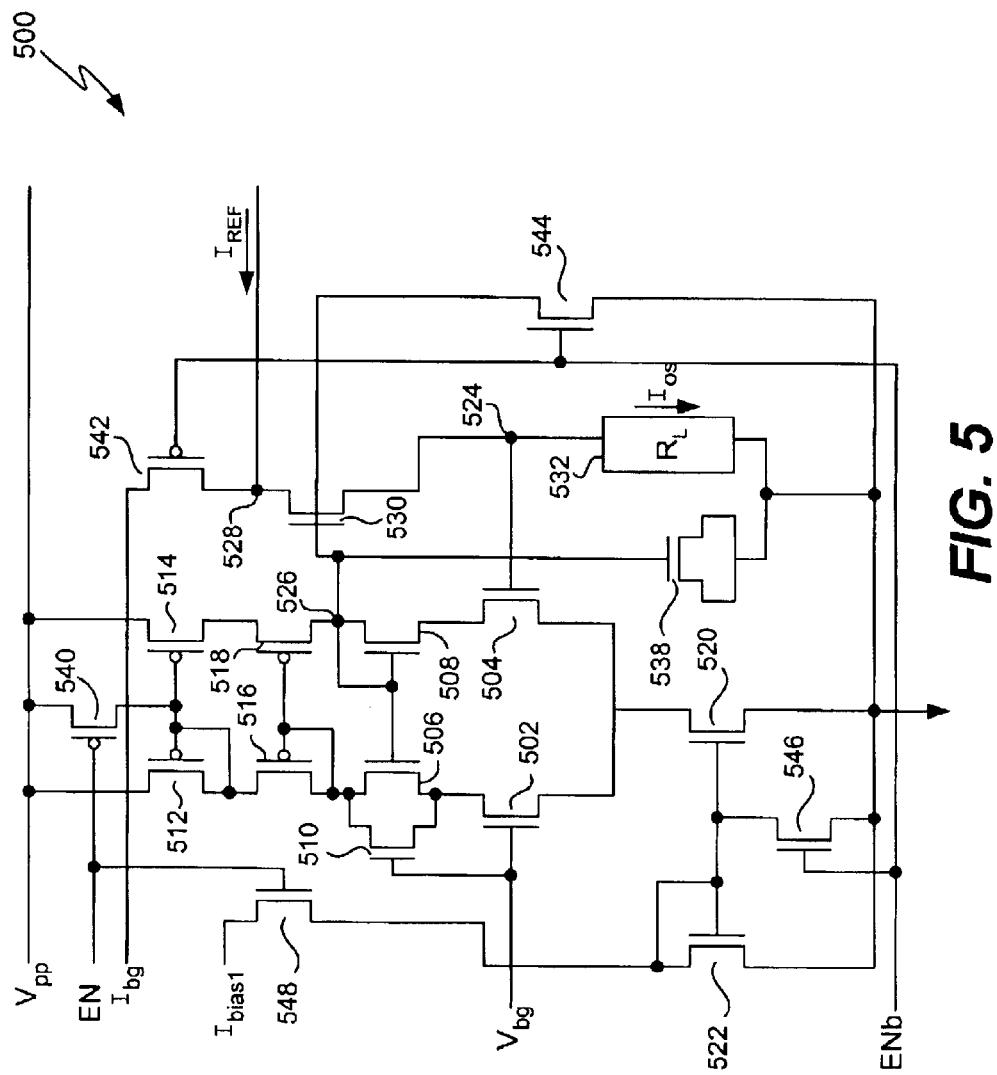
FIG. 5 is a schematic diagram of a reference current generation circuit according to one embodiment of the invention.

FIG. 5 is a schematic diagram of a reference current generation circuit 500 according to one embodiment of the invention. The reference current generation circuit 500 produces a reference current $I_{REF}$ that provides negative temperature compensation when utilized in generating voltages, such as by the DAC 202, the resistor ladder 252 or the resistor ladder 304 illustrated in FIG. 3A. The reference current generation circuit 500 is, for example, suitable for use as the components 402–410 illustrated in FIG. 4.

The reference current generation circuit 500 includes transistors 502–508 that form a differential amplifier, transistors 512–518 that form a cascoded load, and transistors 520 and 522 provide a current mirror current source for the differential amplifier. The transistors 512 and 514 couple to a voltage potential $V_{PP}$. The differential amplifier receives an input voltage $V_{bg}$ and produces an output voltage that is supplied to node 524. A node 526 is provided between the transistor 508 of the differential amplifier and the transistor 518 of the cascoded load. In addition, an output node 528 receives a reference current $I_{REF}$ that is provided to the reference current generation circuit 500. The output node 528 also is supplied with a band gap current $I_{bg}$ (via transistor 542). A transistor 530 is coupled between the nodes 524 and 528 and controlled by the node 526. The node 524 is also coupled to the second voltage potential (ground) via resister $R_L$ 532. A transistor 538, which serves as a capacitor, is also coupled to the node 526 and the second voltage potential (ground).

Additionally, the reference current generation circuit 500 receives enable signals (EN and ENb) to enable the reference current generation circuit 500 by way of transistors 540–548. Hence, when the reference current generation circuit 500 is to be activated, the enable signal (EN) is "high" and the complimentary enable signal (ENb) is "low." In such case, the transistor 540 is "off," the transistor 542 is "on," the transistor 544 is "off," the transistor 546 is "off," and the transistor 548 is "on." The transistor 548 receives a bias current input ($I_{bias1}$) that is supplied to the transistor 522.

Figure 6:
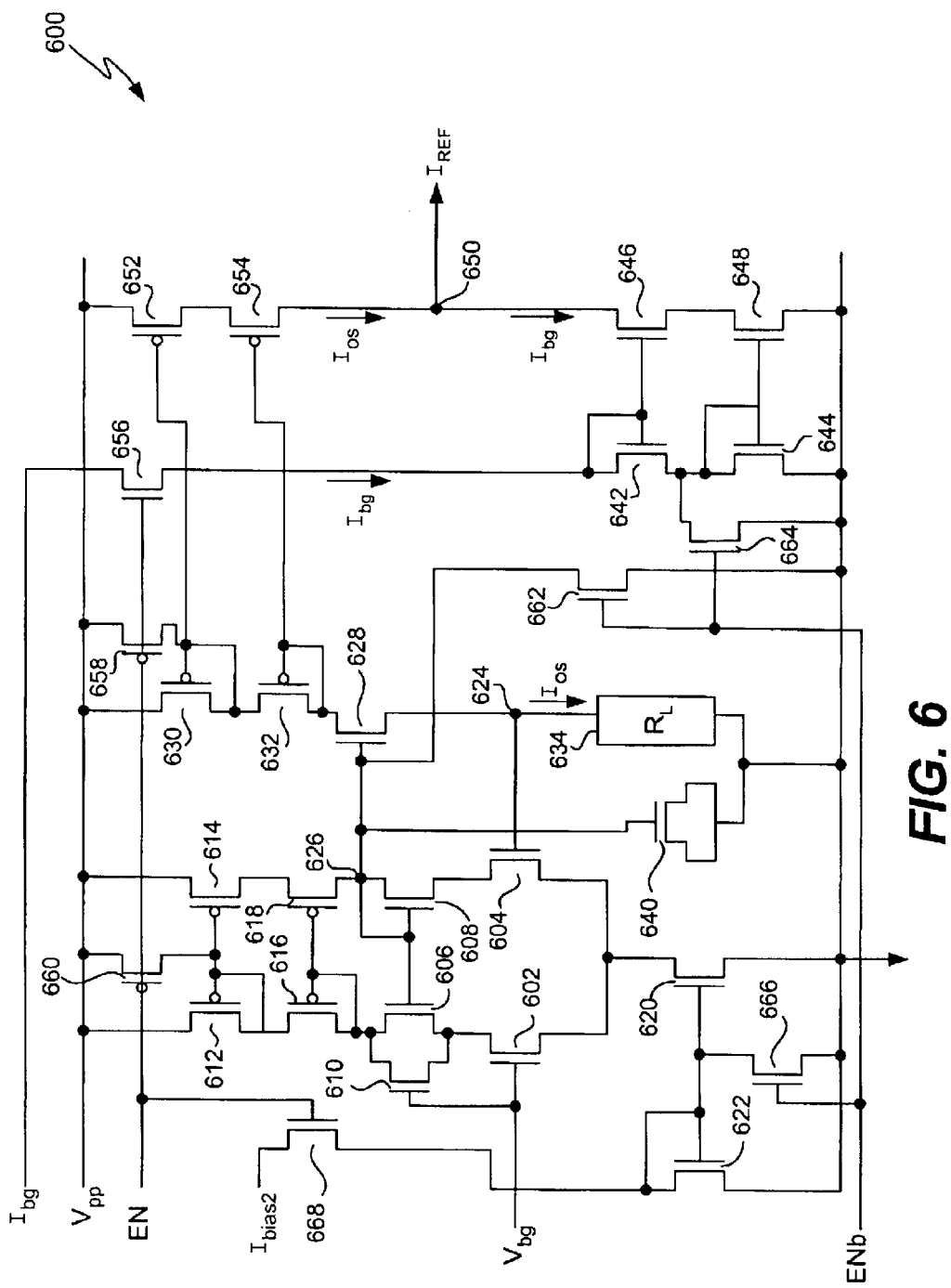
FIG. 6 is a schematic diagram of a reference current generation circuit according to one embodiment of the invention.

FIG. 6 is a schematic diagram of a reference current generation circuit 600 according to one embodiment of the invention. The reference current generation circuit 600 produces a reference current $I_{REF}$ that provides positive temperature compensation when utilized in generating voltages, such as by the DAC 202, the resister ladder 252 or the resistor ladder 304 illustrated in FIG. 3A. The reference current generation circuit 600 is, for example, suitable for use as the components 402–410 illustrated in FIG. 4.

The reference current generation circuit 600 includes transistors 602–608 that form a differential amplifier, transistors 612–618 that form a cascoded load, and transistors 620 and 622 provide a current mirror current source for the differential amplifier. The transistors 612 and 614 couple to a voltage potential $V_{PP}$. The differential amplifier receives an input voltage $V_{bg}$ and produces an output voltage that is supplied to node 624. A node 626 is provided between the transistor 608 of the differential amplifier and the transistor 618 of the cascoded load. In addition, transistors 630 and 632 provide a current from the voltage potential $V_{PP}$ to the transistor 628 which is controlled by the voltage produced at the node 626. The transistor 628 thus causes a current $I_{os}$ to flow through the transistor 628 to the node 624. The node 624 is also coupled to the second voltage potential (ground) via resister $R_L$ 634. More particularly, the resistor $R_L$ 634 is coupled between the node 624 and the second voltage potential (ground). A transistor 640 is also coupled to the node 626 and the second voltage potential (ground).

The reference current generation circuit 600 also includes transistors 642. 644, 646 and 648 operate as a current mirror by producing a band-gap current $I_{bg}$. at node 650. Transistors 652 and 654 together with the transistors 630 and 632 operate as a current mirror by producing an offset current $I_{os}$ at the node 650. The resulting current at the node 650 is a reference current $I_{REF}$. The reference current $I_{REF}$ is equal to the band gap current $I_{bg}$ minus the offset current $I_{os}$.

Additionally, the reference current generation circuit 600 receives enable signals (EN and ENb) to enable the reference current generation circuit 600 by way of transistors 656–670. Hence, when the reference current generation circuit 600 is to be activated, the enable signal (EN) is "high" and the complimentary enable signal (ENb) is "low." In such case, the transistor 656 is "on" to supply the band gap current $I_{bg}$ to the transistors 642 and 644, the transistors 658 and 660 are "off," the transistor 662 and 664 are "off," the transistor 666 is "off," and the transistor 668 is "on." The transistor 668 receives a bias current input ($I_{bias2}$) that is supplied to the transistor 622.

The reference current generation circuits 600 and 700 can, but need not, be both used in same design. For example, the current DAC 400 illustrated in FIG. 4 can have two different circuits for producing a reference current $I_{REF}$. With such a design the current DAC is able to support temperature compensation in either a positive or negative direction. Typically, separate enable lines (EN) would be used for the different circuitry such that the compensation direction could be configured by activation of the appropriate enable lines.

Figure 7:
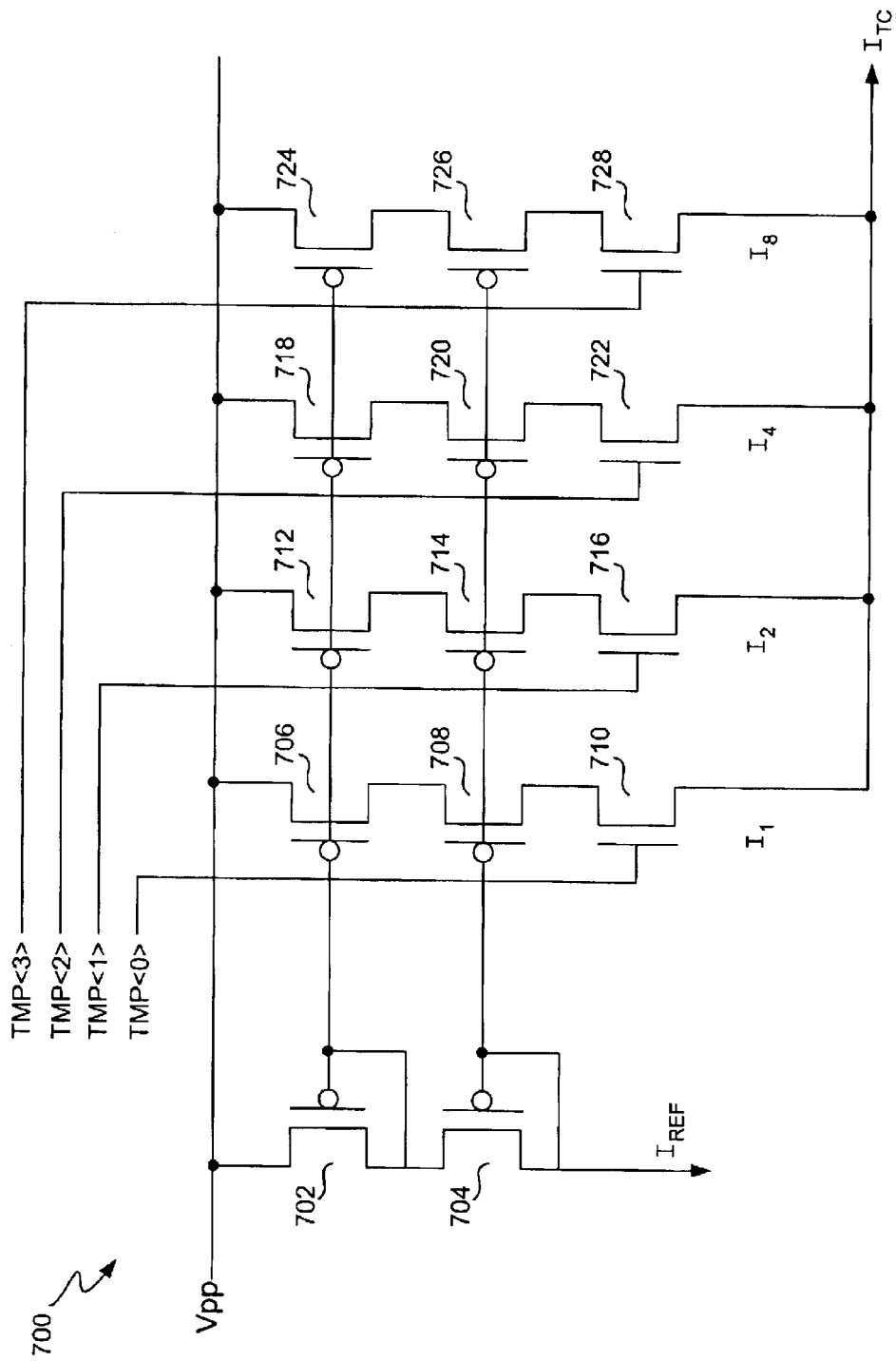
FIG. 7 is a schematic diagram of a current mirror-based DAC according to one embodiment of the invention.

FIG. 7 is a schematic diagram of a current mirror-based DAC 700 according to one embodiment of the invention. The current mirror-base DAC 700 provides for the ability to scale the current $I_{TC}$ to alter the extent or degree of temperature compensation being introduced. For example, by increasing the magnitude of the current ITC greater temperature compensation to the resulting voltage levels can be achieved. The current mirror-based DAC 700 is, for example, suitable for use as the components 412–416 illustrated in FIG. 4.

Hence, the current mirror-based DAC 700 receives a temperature coefficient signal TMP<3:0> that supplies four (4) bits of information regarding the magnitude of the current $I_{TC}$ desired. The greater the temperature coefficient, the greater the variance in the magnitude of the $I_{TC}$ that is produced. In effect, the temperature coefficient signal TMP<3:0> is an input to the current mirror-based DAC 700 that is used to determine the current $I_{TC}$.

The current mirror-based DAC 700 includes transistors 702 and 704 that operate as a variable current source to produce the current $I_{REF}$. For example, the current $I_{REF}$ produced by the transistors 702 and 704 could be the reference current $I_{REF}$ supplied to the reference current generation circuit 500 illustrated in FIG. 5 or to the reference current generation circuit 600 illustrated in FIG. 6

Additionally, the current mirror-based DAC 700 includes current mirror transistors 706 and 708 and a control transistor 710. The current mirror transistors 706 and 708 produce a mirrored current I1 and the control transistor 710 controls whether the current I1 is contributes to the current ITC. The control transistor 710 is controlled by the temperature coefficient signal TMP<0>. Additionally, the current mirror-based DAC 700 include current mirror transistors 712 and 714 that produce a mirrored current $I_2$ and a control transistor 716 that controls when the current $I_2$ contributes to the current ITC. The control transistor 716 is controlled by the temperature coefficient signal TMP<1>. The current mirror-based DAC 700 also includes current mirror transistors 718 and 720 that produce a mirrored current $I_4$ and a control transistor 722 that controls when the current $I_4$ contributes to the current $I_{TC}$. The control transistor 722 is controlled by the temperature coefficient signal TMP<2>. Further, the current mirror-based DAC 700 includes current mirror transistors 724 and 726 that produce a mirrored current $I_8$ and a control transistor 728 that controls when the current $I_8$ contributes to the current $I_{TC}$. The control transistor 716 is controlled by the temperature coefficient signal TMP<3>.

In this embodiment, the currents $I_1$, $I_2$, $I_4$ and $I_8$ are provided in a DAC-like fashion. The current $I_2$ is designed to be twice the amount of current of the current $I_1$. Similarly, the current $I_4$ is twice the current of the currant $I_2$, and the current $I_8$ is twice the current of the current $I_4$. Hence, by controlling the temperature coefficient signals (TMP) each of the currents $I_1$, $I_2$, $I_4$ and $I_8$ can be either passed or blocked by the control transistors 710, 716, 722 and 728, respectively, so as to contribute or not to the current $I_{TC}$. In effect, this allows fifteen (15) different levels to be generated for the current $I_{TC}$. Each of these fifteen (15) different levels provides different amounts of temperature compensation to the resulting voltage levels produced by the voltage level generator circuitry. That is, the resulting voltage levels are temperature compensated with a resolution provided by the fifteen (15) different levels for the current $I_{TC}$. For example, in one implementation, the 15 different levels can provide a range of temperature compensation to the resulting voltage levels from 0 to 8 millivolts per degree Celsius. However, it should be understood that in other embodiments, more or less levels can be provided to increase or decrease the resolution and controllability of the current ITC.

The invention can further pertain to an electronic system that includes a memory system as discussed above. Memory systems (i.e., memory cards) are commonly used to store digital data for use with various electronics products. Often, the memory system is removable from the electronic system so the stored digital data is portable. The memory systems according to the invention can have a relatively small form factor and be used to store digital data for electronics products such as cameras, hand-held or notebook computers, network cards, network appliances, set-top boxes, hand-held or other small audio players/recorders (e.g., MP3 devices), and medical monitors.

The advantages of the invention are numerous. Different embodiments or implementations may yield one or more of the following advantages. One advantage of the invention is that data read errors are minimized through use of temperature compensated voltages. Another advantage of the invention is that temperature compensation of generated voltages can be performed in a positive or negative direction. Still another advantage of the invention is that reliable, high performance memory systems can be obtained.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A memory apparatus, said memory apparatus comprising:
   a plurality of memory cells, each of said memory cells having multi-state data storage transistor devices, and said multi-state data storage transistor devices having a temperature dependency; and
   a voltage generation circuit operatively connected with said memory cells, said voltage generation circuit produces a plurality of different voltage levels, each of the different voltage levels produced by said voltage generation circuit having a temperature dependency that substantially offsets the temperature dependency of said multi-state data storage transistor devices,
   wherein said voltage generation circuit comprises a voltage converter that converts a first current supplied to said voltage converter into the plurality of different voltage levels, and a temperature compensation circuit for producing a second current that has a temperature dependency.

2. A memory apparatus as recited in claim 1, wherein the different voltage levels produced by said voltage generation circuit are controllably applied to control gates of said multi-state data storage transistor devices.

3. A memory apparatus as recited in claim 1, wherein said memory apparatus further comprises:
   a multiplexer operatively connected to said voltage generation circuit, said multiplexer operates to receive the different voltage levels and to output one of the different voltage levels.

4. A memory apparatus as recited in claim 1, wherein said voltage generation circuit uses the first current and the second current to produce the different voltage levels with the temperature dependency.

5. A memory apparatus as recited in claim 1, wherein said memory apparatus is a memory card, and wherein said memory cells are non-volatile memory cells.

6. A memory apparatus, said memory apparatus comprising:
   a plurality of memory cells, each of said memory cells having multi-state data storage transistor devices, and said multi-state data storage transistor devices having a temperature dependency; and
   a voltage generation circuit operatively connected with said memory cells, said voltage generation circuit produces a plurality of different voltage levels, each of the different voltage levels produced by said voltage generation circuit having a temperature dependency that substantially offsets the temperature dependency of said multi-state data storage transistor devices,
   wherein when the temperature dependency of said multi-state data storage transistor devices have a negative temperature dependency, then the different voltage levels produced by said voltage generation circuit have a positive temperature dependency, whereby the positive temperature dependency of the different voltage levels substantially offsets the negative temperature dependency of said multi-state data storage transistor devices.

7. A memory apparatus as recited in claim 6, wherein the different voltage levels produced by said voltage generation circuit are controllably applied to control gates of said multi-state data storage transistor devices.

8. A memory apparatus as recited in claim 6, wherein said memory apparatus further comprises:
   a multiplexer operatively connected to said voltage generation circuit, said multiplexer operates to receive the different voltage levels and to output one of the different voltage levels.

9. A memory apparatus as recited in claim 6, wherein said voltage generation circuit comprises a voltage converter that converts a first current supplied to said voltage converter into the plurality of different voltage levels.

10. A memory apparatus as recited in claim 9, wherein said voltage generation circuit further comprises a temperature compensation circuit for producing a second current that has a temperature dependency.

11. A memory apparatus as recited in claim 10, wherein said voltage generation circuit uses the first current and the second current to produce the different voltage levels with the temperature dependency.

12. A memory apparatus as recited in claim 6, wherein said memory apparatus is a memory card, and wherein said memory cells are non-volatile memory cells.

13. A memory apparatus, said memory apparatus comprising:

a plurality of memory cells, each of said memory cells having multi-state data storage transistor devices, and said multi-state data storage transistor devices having a temperature dependency; and a voltage generation circuit operatively connected with said memory cells, said voltage generation circuit produces a plurality of different voltage levels, each of the different voltage levels produced by said voltage generation circuit having a temperature dependency that substantially offsets the temperature dependency of said multi-state data storage transistor devices, wherein when the temperature dependency of said multi-state data storage transistor devices have a positive temperature dependency, then the different voltage levels produced by said voltage generation circuit have a negative temperature dependency, whereby the negative temperature dependency of the different voltage levels substantially offsets the positive temperature dependency of said multi-state data storage transistor devices.

14. A memory apparatus as recited in claim 13, wherein the different voltage levels produced by said voltage generation circuit are controllably applied to control gates of said multi-state data storage transistor devices.

15. A memory apparatus as recited in claim 13, wherein said memory apparatus further comprises:

a multiplexer operatively connected to said voltage generation circuit, said multiplexer operates to receive the different voltage levels and to output one of the different voltage levels.

16. A memory apparatus as recited in claim 13, wherein said voltage generation circuit comprises a voltage converter that converts a first current supplied to said voltage converter into the plurality of different voltage levels.

17. A memory apparatus as recited in claim 16, wherein said voltage generation circuit further comprises a temperature compensation circuit for producing a second current that has a temperature dependency.

18. A memory apparatus as recited in claim 17, wherein said voltage generation circuit uses the first current and the second current to produce the different voltage levels with the temperature dependency.

19. A memory apparatus, said memory apparatus comprising:

a plurality of memory cells, each of said memory cells having multi-state data storage transistor devices, and said multi-state data storage transistor devices having a temperature dependency; and means for generating a plurality of different voltage levels, each of the different voltage levels produced by said voltage generation circuit having a temperature dependency that counteracts the temperature dependency of said multi-state data storage transistor devices, wherein when the temperature dependency of said multi-state data storage transistor devices have a negative temperature dependency, then the different voltage levels produced by said means for generating have a positive temperature dependency, whereby the positive temperature dependency of the different voltage levels substantially offsets the negative temperature dependency of said multi-state data storage transistor devices.

20. A memory apparatus as recited in claim 19, wherein said memory apparatus is a memory card, and wherein said memory cells are non-volatile memory cells.

21. A memory apparatus, said memory apparatus comprising:

a plurality of memory cells, each of said memory cells having multi-state data storage transistor devices, and said multi-state data storage transistor devices having a temperature dependency; and means for generating a plurality of different voltage levels, each of the different voltage levels produced by said voltage generation circuit having a temperature dependency that counteracts the temperature dependency of said multi-state data storage transistor devices, wherein when the temperature dependency of said multi-state data storage transistor devices have a positive temperature dependency, then the different voltage levels produced by said means for generating have a negative temperature dependency, whereby the negative temperature dependency of the different voltage levels substantially offsets the positive temperature dependency of said multi-state data storage transistor devices.

* * * * *

UNITED STATES PATENT AND TRADEMARK OFFICE
CERTIFICATE OF CORRECTION

PATENT NO. : 6,801,454 B2
DATED : October 5, 2004
INVENTOR(S) : Wang et al.

It is certified that error appears in the above-identified patent and that said Letters Patent is hereby corrected as shown below:

Column 2,
Lines 48-49, add -- FIG. 3B is a graph illustrating current verses temperature for voltage generation according to one embodiment of the invention --.

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,801,454 B2
DATED : October 5, 2004
INVENTOR(S) : Wang et al.

It is certified that error appears in the above-identified patent and that said Letters Patent is hereby corrected as shown below:

Title page,
Item [56], References Cited, U.S. PATENT DOCUMENTS, add the following:
-- 5,864,504    01/1999    Tanzawa et al. ......................365/185.24
   6,577, 535 B2  06/2003    Pasternak ............................365/185.11
   2002/109539   08/2002    Takeuchi et al. .......................327/513 --
FOREIGN PATENT DOCUMENTS, add the following:
-- 2000011671           01/14/00                    Japan --
OTHER PUBLICATIONS, add the following:
-- Communication Relating to Partial International Search re: PCT/US03/31140 --

Signed and Sealed this

Thirty-first Day of May, 2005

JON W. DUDAS
*Director of the United States Patent and Trademark Office*